(12) United States Patent
Nishizawa et al.

(10) Patent No.: US 7,515,017 B2
(45) Date of Patent: Apr. 7, 2009

(54) SURFACE ACOUSTIC WAVE DEVICE UTILIZING A TERMINAL ROUTING PATTERN

(75) Inventors: Toshio Nishizawa, Yokohama (JP); Koichi Hatano, Yokohama (JP)

(73) Assignee: Fujitsu Media Devices Limited, Yokohama (JP)

( * ) Notice: Subject to any disclaimer, the term of this patent is extended or adjusted under 35 U.S.C. 154(b) by 361 days.

(21) Appl. No.: 11/400,403

(22) Filed: Apr. 10, 2006

(65) Prior Publication Data
US 2007/0090895 A1    Apr. 26, 2007

(30) Foreign Application Priority Data
Oct. 26, 2005    (JP) ................. 2005-310901

(51) Int. Cl.
H03H 9/72    (2006.01)
H03H 9/64    (2006.01)
(52) U.S. Cl. ............... 333/133; 333/195; 310/313 D
(58) Field of Classification Search ........... 333/193, 333/195, 133; 310/313 D
See application file for complete search history.

(56) References Cited

U.S. PATENT DOCUMENTS

| | | | | |
|---|---|---|---|---|
| 4,425,554 | A * | 1/1984 | Morishita et al. | 333/195 |
| 5,936,488 | A * | 8/1999 | Taguchi et al. | 333/195 |
| 6,329,888 | B1 * | 12/2001 | Hirota | 333/193 |
| 6,597,262 | B2 * | 7/2003 | Takamine | 333/193 |
| 6,828,879 | B2 * | 12/2004 | Tanaka et al. | 333/195 |
| 7,019,435 | B2 * | 3/2006 | Nakaya et al. | 310/313 D |
| 7,292,122 | B2 * | 11/2007 | Kanasaki et al. | 333/193 |
| 2004/0251776 | A1 | 12/2004 | Shibahara et al. | |
| 2005/0242903 | A1 * | 11/2005 | Inoue et al. | 333/195 |
| 2007/0279156 | A1 * | 12/2007 | Pitschi et al. | 333/193 |

FOREIGN PATENT DOCUMENTS

| | | |
|---|---|---|
| EP | 1137177 A2 | 9/2001 |
| EP | 1237275 A2 | 9/2002 |
| EP | 1263137 A2 | 12/2002 |
| EP | 1289136 A2 | 3/2003 |

(Continued)

OTHER PUBLICATIONS

Hiromi Yatsuda, et al., "Miniaturized Saw Filters Using a Flip-Chip Technique," IEEE Transaction on Ultrasonics, Ferroelectrics and Frequency Control, IEEE Service Center, Piscataway NJ, US., vol. 43, No. 1, Jan. 1996, pp. 125-129, XP000557496 ISSN: 0885-3010.

*Primary Examiner*—Barbara Summons
(74) *Attorney, Agent, or Firm*—Arent Fox LLP

(57) ABSTRACT

A surface acoustic wave device having a surface acoustic wave filter having a comb-shaped electrode pattern formed on a piezoelectric element, electrode terminals for inputting and outputting of the surface acoustic wave filter are connected with corresponding electrode patterns of a package through bumps, wherein the comb-shaped electrode pattern has a pair of reflective electrodes, and an input comb-shaped electrode and an output comb-shaped electrode disposed between the pair of reflective electrodes; and an electrode terminal of either the input comb-shaped electrode or an output comb-shaped electrode is disposed such that the electrode terminal is positioned on the side opposite to the side of the other electrode terminal sandwiching a grounded electrode using a routing pattern.

18 Claims, 16 Drawing Sheets

FOREIGN PATENT DOCUMENTS

| | | |
|---|---|---|
| EP | 1411635 A2 | 4/2004 |
| EP | 1533895 A2 | 5/2005 |
| JP | 09-121137 A | 5/1997 |
| JP | 11-122072 A | 4/1999 |
| JP | 2002-503414 | 1/2002 |
| JP | 2002-141771 | 5/2002 |
| JP | 2002-231849 A | 8/2002 |
| JP | 2003-78385 A | 3/2003 |
| JP | 2003-318694 | 11/2003 |
| JP | 2004-194269 | 7/2004 |
| JP | 2004-251776 A | 9/2004 |
| JP | 2005-277522 | 10/2005 |
| WO | WO 2004/109911 | * 12/2004 |

* cited by examiner

PASS-BAND CHARACTERISTICS (ANTENNA TO RECEPTION)

ISOLATION (TRANSMISSION TO RECEPTION)

US 7,515,017 B2

SURFACE ACOUSTIC WAVE DEVICE UTILIZING A TERMINAL ROUTING PATTERN

CROSS-REFERENCE TO RELATED APPLICATIONS

This application is based upon and claims the benefit of priority from the prior Japanese Patent Application No. 2005-310901, filed on Oct. 26, 2005, the entire contents of which are incorporated herein by reference.

BACKGROUND OF THE INVENTION

1. Field of the Invention

The present invention relates to a flip-chip-mounted surface acoustic wave device capable of downsizing.

2. Description of the Related Art

In recent years, downsizing and upgrading of functions are rapidly advancing for wireless devices such as mobile phones. Filters are used for the high-frequency circuits of those devices and play an important role. Generally, such filters are often configured using SAW (Surface Acoustic Wave) devices in order to downsize those circuits.

For example, in a wireless device such as a PCS (Personal Communication System) mobile phone, a transmission (Tx) filter and a reception (Rx) filter constituting the function of an antenna duplexer having a role of isolating a transmission (Tx: 1,850 to 1,910 MHz) signal and a reception (Rx: 1,930 to 1,990 MHz) signal from each other, are constituted of SAW apparatuses.

The above transmission (Tx) filter and the reception (Rx) filter are band-pass filters and are constituted of, for example, as described in Japanese Patent Application Laid-Open Publication No. 2004-194269, a combination of multiple (double) -mode SAW filters (DMS) having a plurality of (two) resonance modes by utilizing a plurality of (two) standing waves generated between reflecting electrodes.

As a double-mode SAW filter, an IDT (interdigital transducer) pattern as described in Japanese Patent Application Laid-Open Publication No. 2004-194269 as an example is shown in FIG. 1 is formed on a piezoelectric element (piezoelectric substrate) not shown such as $LiTaO_3$, $LiNbO_3$, $Li_2B_4O_7$ or crystal.

In the example shown in FIG. 1, the IDT pattern formed on a piezoelectric element has 1 (one) input (output) IDT1 and 2 (two) outputs (inputs) IDT2a and 2b arranged alternately, and grating-type reflectors 3a and 3b positioned in the propagation direction of the surface acoustic wave on both sides sandwiching those input and outputs.

A characteristic of the IDT pattern shown in FIG. 1 is that the terminal IN (OUT) of the input (output) IDT1 and the terminal OUT (IN) connected commonly with the 2 (two) outputs (inputs) IDT2a and 2b are arranged on the same side.

Employing the IDT pattern shown in FIG. 1 as a unit, the filter is constituted by connecting a plurality of IDT patterns in parallel or in series (in a cascade) in response to a desired filter performance that is aimed at.

FIG. 2 is a plan view of a double-mode SAW filter (DMS) which includes 3 (three) parallel-cascade-connected units, employing the IDT pattern shown in FIG. 1 as a unit, and 3 (three) unit IDT patterns are connected in parallel cascades on a piezoelectric element 10.

FIG. 3 is a sectional view of a surface acoustic wave (SAW) device formed with a double-mode SAW filter (DMS) having the IDT pattern shown in FIG. 2, housed in a package. In this surface acoustic wave (SAW) device, a double-mode SAW filter (DMS) is pasted on the internal bottom surface of a ceramic package 11 with conductive paste 12. As the double-mode SAW filter (DMS), the IDT patterns are formed on the piezoelectric element 10 and the input terminal IN and the output terminal OUT and GND are connected with terminals on the ceramic package 11 side with bonding wires 13. A metal cap 14 is pasted covering the interior of the ceramic package 11 leaving a spatial spacing larger than a predetermined spatial spacing between the IDT pattern and the cap 14 itself.

The surface acoustic wave device has a limitation on its downsizing because the bonding wires 13 need a spatial spacing larger than a predetermined spatial spacing between the metal cap 14 and the IDT patterns. Therefore, instead of a configuration where the double-mode SAW filter (DMS) is connected with the terminals on the ceramic package side with the bonding wires 13, a configuration can be envisaged, where the double-mode SAW filter (DMS) is connected with the terminals on the ceramic package side with flip-chip connection.

FIG. 4 is a sectional view of an exemplary configuration envisaged when the double-mode SAW filter having the IDT patterns shown in FIG. 2 is mounted on a ceramic package with flip-chip connection.

Grounded terminals GND, an input terminal IN and an output terminal OUT are formed on the ceramic package 11 side.

The grounded terminals GND, the input terminal IN and the output terminal OUT of the IDT pattern on the IDT pattern side are each connected to the grounded terminals GND, the input terminal IN and the output terminal OUT on the ceramic package side such that each of those terminals corresponds to its own counterpart, with the side of the IDT patterns formed on the piezoelectric element 10 of the double-mode SAW filter (DMS) being set facing downward. Thereby, reduction of the area and the height for accommodating the double-mode SAW filter (DMS) in a ceramic package can be facilitated.

However, as shown in FIG. 4, when the double-mode SAW filter is accommodated in the ceramic package with flip-chip connection, degradation of the electrical characteristics of the SAW filter is recognized. FIGS. 5A and 5B are graphs showing and comparing the electrical characteristics of the double-mode SAW filter having the same configuration, that is, the double-mode SAW filter having the terminal IN (OUT) of the input (output) IDT1 and the terminal OUT (IN) connected commonly with the 2 (two) outputs (inputs) IDT2a and 2b arranged on the same side, accommodated in the ceramic package with wire bonding, with the electrical characteristics of the double-mode SAW filter accommodated in another ceramic package with flip-chip bonding.

That is, in FIGS. 5, the graph, FIG. 5A shows the pass-band characteristics of a receiving filter for guiding a received signal in a duplexer from an antenna to a receiving circuit. The graph, FIG. 5B shows the isolation of the duplexer from the transmitting side to the receiving side.

In general, to a receiving antenna filter in a PCS duplexer, an amount of attenuation equal to or more than 50 dB in a transmission band is required. 55 dB is required as the standard value for isolation in a transmission band.

As shown in FIG. 5A, a attenuation characteristics II outside the pass-bands from antenna to receiving side of the duplexer obtained when the filter is accommodated in a ceramic package with flip-chip bonding is degraded compared to an attenuation characteristics I in the case where the filter is accommodated with wire bonding, and has a region which does not satisfy the amount of attenuation equal to or more than 50 dB.

As shown in FIG. 5B, an isolation II from the transmission side to the receiving side of the duplexer obtained when the filter is accommodated in a ceramic package with flip-chip bonding has, compared to the case I with wire bonding, a region which does not satisfy the standard value of 55 dB for isolation.

The cause of the degradation of the electrical characteristics of the double-mode SAW filter in the case with flip-chip bonding is estimated that the spacing between the input terminal and the output terminal in the ceramic package is too narrow when the double-mode SAW filter is accommodated in the ceramic package with flip-chip bonding and, thereby, a capacity between the input terminal and the output terminal becomes large.

Based on the above estimation, the inventors measured the pass band characteristics of a double-mode SAW filter which has, as shown in FIG. 6, a wider spacing between the IN (OUT) terminal and the OUT (IN) terminal, and a GND pattern 4 formed in an area not limited to the surface layer and the internal layer of the ceramic package such that the GND pattern 4 corresponds to an area between the IN (OUT) terminal and the OUT (IN) terminal of the IDT pattern, compared to the IDT pattern in FIG. 1.

FIG. 7 is a diagram showing a terminal pattern on the ceramic package side corresponding to the IDT pattern of FIG. 6. The spacing between the IN (OUT) terminal and the OUT (IN) terminal is widened such that a grounding GND line (Line) can be formed in the spacing.

As described above, according to the configuration of FIG. 6, the IN (OUT) terminal and the OUT (IN) terminal are separated by the GND pattern 4 and, therefore, the corresponding coupling capacity formed between the input terminal and the output terminal can be reduced.

FIG. 8 is a graph of the pass band characteristics showing the effect of the reduction of the coupling capacity formed between the input terminal and the output terminal due to the above GND pattern 4.

As shown in FIG. 8, it can be understood that an amount of attenuation out of the pass band can be made larger in the direction of the arrows due to the reduction of the coupling capacity formed between the input terminal and the output terminal.

However, according to the above configuration, widening of the spacing between the input terminal and the output terminal is required in order to form the GND pattern 4 as shown in FIG. 7 and, because of this, the device configuration spreads out over a plane and, thereby, achieving downsizing is prevented.

SUMMARY OF THE INVENTION

Considering the above problems, the object of the present invention is to provide a surface acoustic wave device having a characteristic layout of the arrangement of the input terminal and the output terminal, that avoids the above problems in order to obtain excellent filter performance and prevents the device configuration from becoming large in a plane.

In order to achieve the above object, according to a first aspect of the present invention there is provided a surface acoustic wave device comprising a surface acoustic wave filter having a comb-shaped electrode pattern formed on a piezoelectric element, with electrode terminals for inputting and outputting of the surface acoustic wave filter connected with corresponding electrode patterns of a package through bumps, wherein the comb-shaped electrode pattern has a pair of reflective electrodes, and an input comb-shaped electrode and an output comb-shaped electrode disposed between the pair of reflective electrodes, and wherein an electrode terminal of one of the input comb-shaped electrode and the output comb-shaped electrode is positioned opposite to an electrode terminal of the other comb-shaped electrode with a grounded electrode disposed therebetween using a routing pattern. The surface acoustic wave filter may be a multi-mode surface acoustic wave filter that uses a surface acoustic wave excited between the reflective electrodes and utilizes a plurality of standing waves generated between the reflective electrodes.

In order to achieve the above object, according to a second aspect of the present invention there is provided a surface acoustic wave device comprising a first and a second surface acoustic wave filters each having a comb-shaped electrode pattern formed on a piezoelectric element, the first and the second acoustic wave filters connected with each other in a cascade, with electrode terminals for inputting and outputting of the surface acoustic wave filters connected with corresponding electrode patterns of a package through bumps, wherein the comb-shaped electrode patterns of the first and the second surface acoustic wave filters each have a pair of reflective electrodes, and an input comb-shaped electrode and an output comb-shaped electrode disposed between the pair of reflective electrodes, wherein electrode terminals of the input and the output comb-shaped electrodes are drawn out from the same side for each of the first and the second surface acoustic wave filters, and wherein the electrode terminal of the output (or input) comb-shaped electrode of the first surface acoustic wave filter is connected with the electrode terminal of the input (or output) comb-shaped electrode of the second surface acoustic wave filter using a routing pattern, the electrode terminals of the input and output comb-shaped electrodes of the first surface acoustic wave filter facing the second surface acoustic wave filter with a grounded terminal of the second surface acoustic wave filter disposed therebetween.

In order to achieve the above object, according to a third aspect of the present invention there is provided a surface acoustic wave device comprising a first and a second surface acoustic wave filters connected with each other in a cascade, with electrode terminals for inputting and outputting of the surface acoustic wave filters connected with corresponding electrode patterns of a package through bumps, wherein the comb-shaped electrode patterns of the first and the second surface acoustic wave filters each have a pair of reflective electrodes, and an input comb-shaped electrode and an output comb-shaped electrode disposed between the pair of reflective electrodes, wherein electrode terminals of the input and the output comb-shaped electrodes are drawn from the same side for each of the first and the second surface acoustic wave filters, and wherein the electrode terminal of the output (or input) comb-shaped electrode of the first surface acoustic wave filter is connected with the electrode terminal of the input (or output) comb-shaped electrode of the second surface acoustic wave filter using a routing pattern, with a grounded terminal of the first surface acoustic wave filter facing a grounded terminal of the second surface acoustic wave filter. The comb-shaped electrode pattern may be arranged to connect in series filters that are formed by dividing a filter into two such that a desired impedance can be obtained. The electrode pattern of at least one surface acoustic wave filter of the first and the second surface acoustic wave filter may be arranged to connect in series filters that are formed by dividing a filter into two such that a desired impedance can be obtained. The surface acoustic wave device may further comprise a plurality of the surface acoustic wave filters connected in parallel. The input (or output) terminal of the surface acoustic wave filter maybe a balancing input (or output). An electrode pattern of the package may be an inductance component constituting the filter.

In order to achieve the above object, according to a fourth aspect of the present invention there is provided an antenna duplexer comprising the surface acoustic wave device according to claims 1 to 9 as a transmission and/or reception filter(s). The grounding pattern may be formed between an electrode pattern for transmission (Tx) signal connected with the transmission filter and an electrode pattern for reception (Rx) signal connected with the reception filter in the package.

According to the present invention, by providing a grounding GND pattern between an input pattern and an output pattern in an area not limited to the surface layer and the internal layer of a package, the coupling capacity formed between the input terminal and the output terminal of the package can be reduced, that is, the coupling capacity formed between the input terminal and the output terminal of the surface acoustic wave device itself can be reduced.

Due to this effect, degradation of the electrical characteristics can be avoided by flip-chip-mounting and, by applying the present invention, a surface acoustic wave device which has low insertion loss and high attenuation characteristics even when the device is flip-chip-mounted can be provided.

DESCRIPTION OF THE PREFERRED EMBODIMENTS

Exemplary embodiments of the present invention will be described below referring to the attached drawings.

Figure 9A:
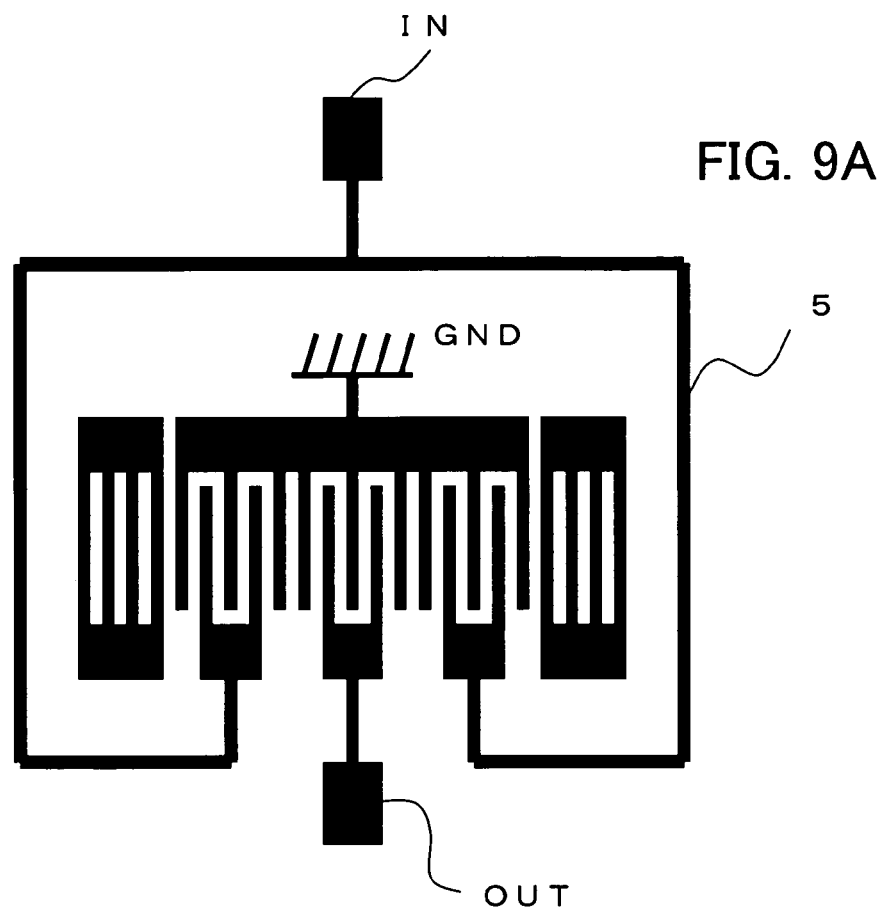
FIG. 9A shows an IDT pattern of the first embodiment.
Figure 9B:
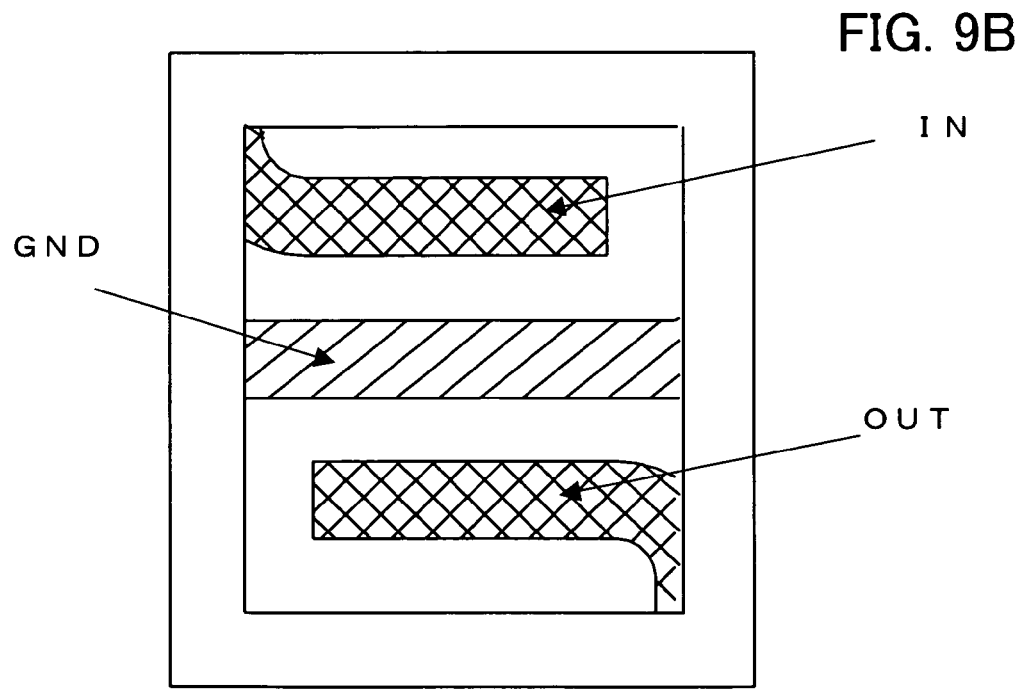
FIG. 9B shows the arrangement of the electrodes on the ceramic package side for flip-chip mounting in the first embodiment.

FIGS. 9A and 9B are diagrams showing a first embodiment of a basic IDT pattern of a double-mode SAW filter according to the present invention. As described above, such an IDT pattern is formed on a piezoelectric element and a filter is constituted. The filter is accommodated in a ceramic package and a surface acoustic wave device is formed. FIG. 9A shows an IDT pattern of the first embodiment and FIG. 9B shows the arrangement of the electrodes on the ceramic package side for flip-chip mounting.

Figure 1:
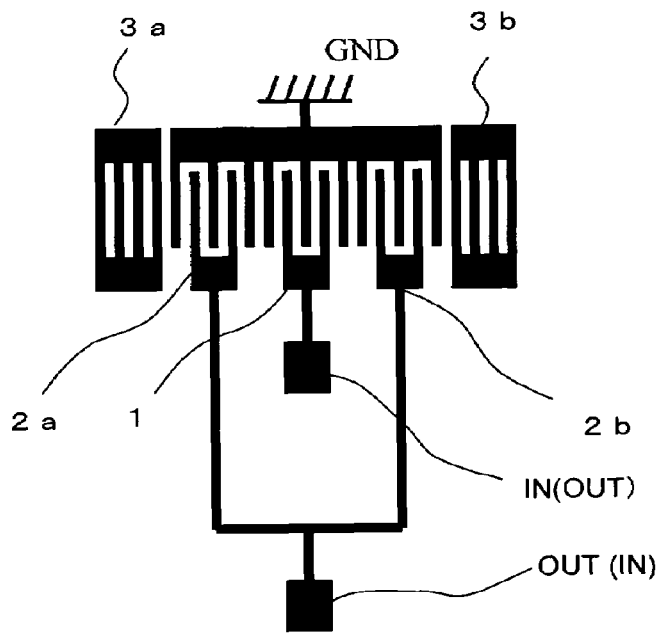
FIG. 1 is an example showing an IDT pattern of the conventional multiple-mode SAW filter.
Figure 2:
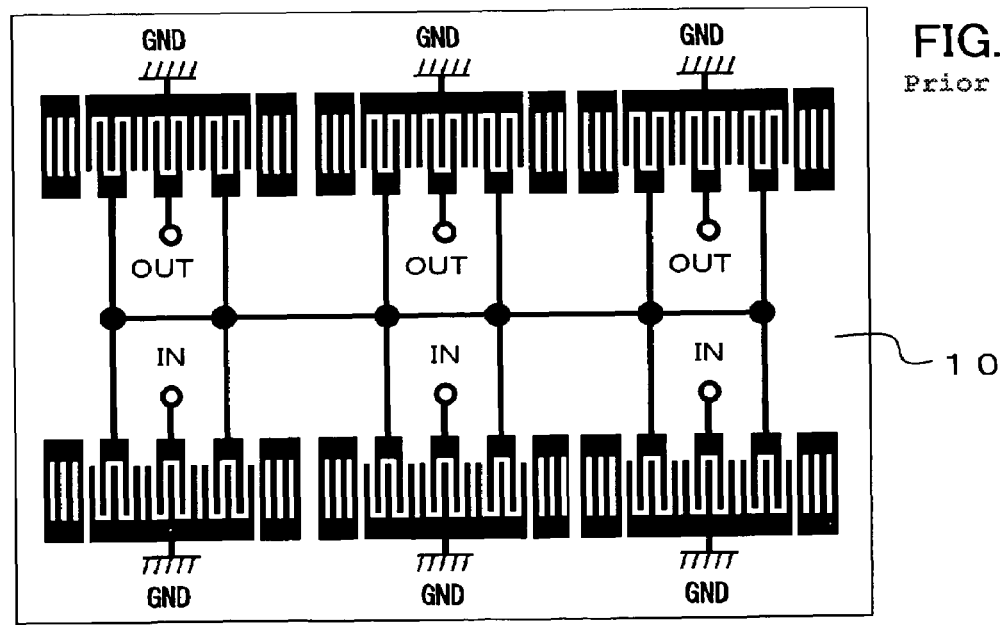
FIG. 2 is a plan view of a double-mode SAW filter (DMS) which includes 3 (three) parallel-cascade-connected units, employing the IDT pattern shown in FIG. 1 as a unit.
Figure 3:
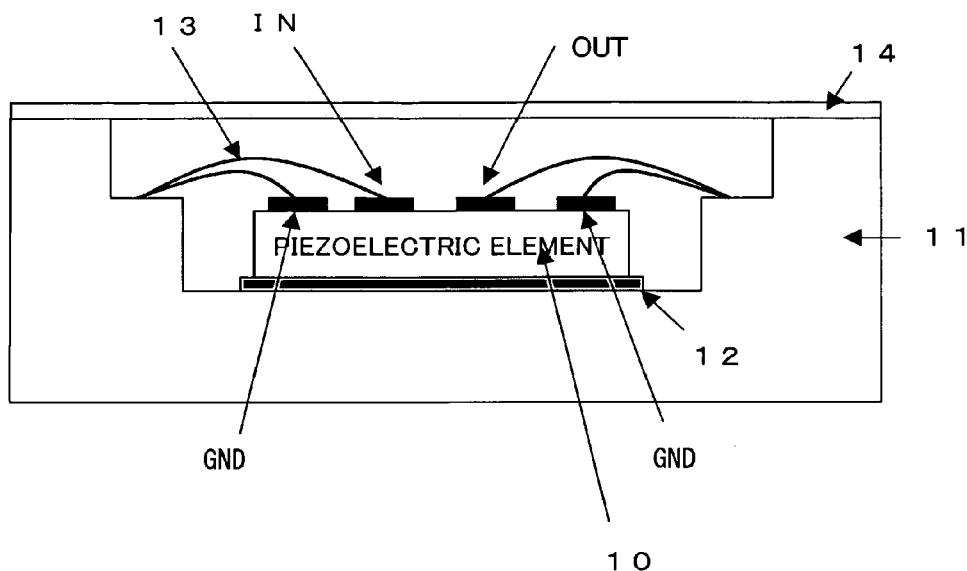
FIG. 3 is a sectional view of a surface acoustic wave (SAW) device formed with a double-mode SAW filter (DMS) having the IDT pattern shown in FIG. 2, housed in a package.
Figure 4:
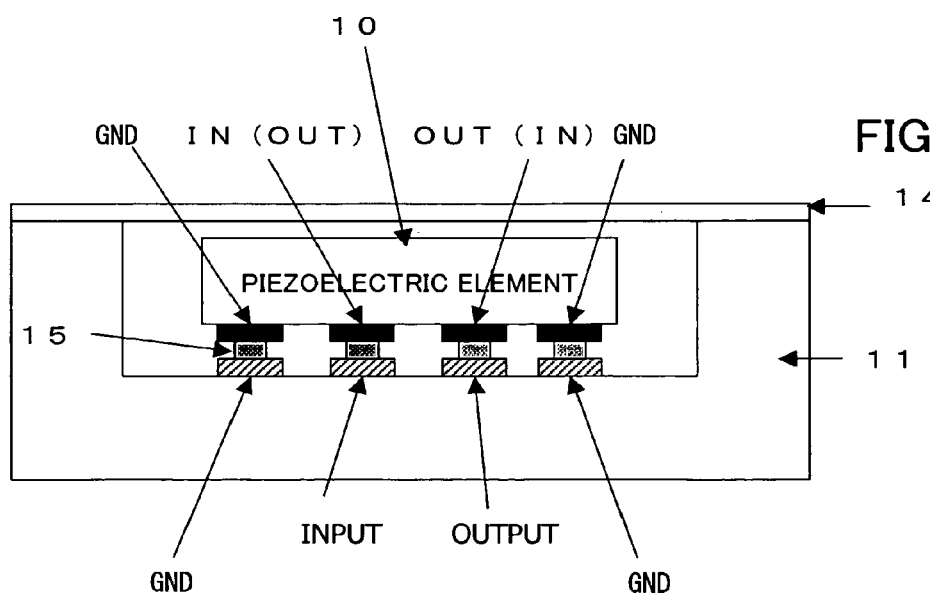
FIG. 4 is a sectional view of an exemplary configuration envisaged when the double-mode SAW filter having the IDT patterns shown in FIG. 2 is mounted on a ceramic package with flip-chip connection.
Figure 5A:
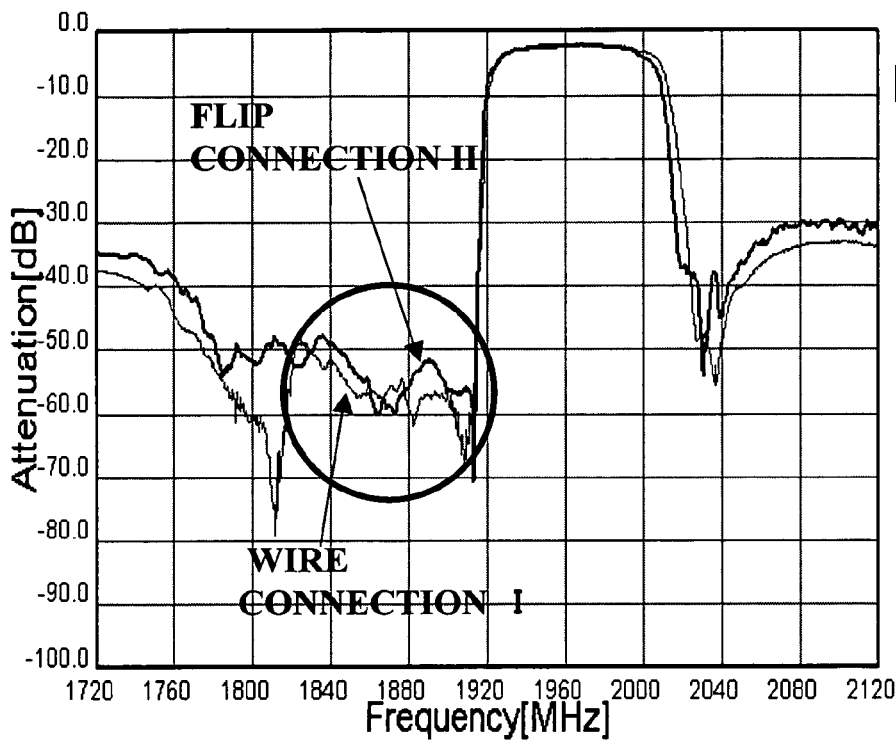
FIG. 5A shows the pass-band characteristics of a receiving filter for guiding a received signal in a duplexer from an antenna to a receiving circuit.
Figure 5B:
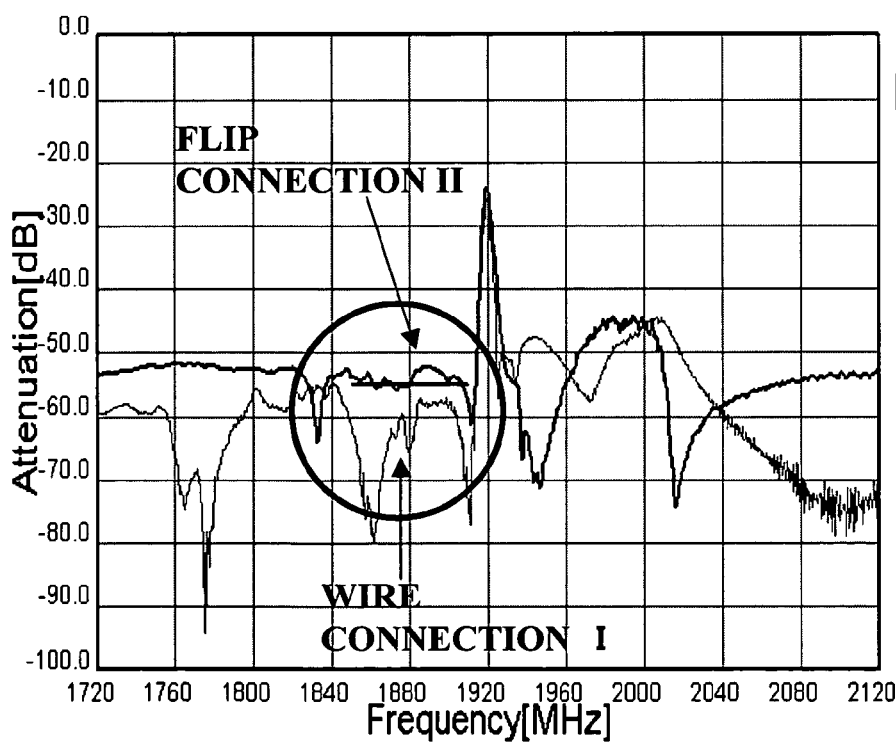
FIG. 5B shows the isolation of the duplexer from the transmitting side to the receiving side.
Figure 6:
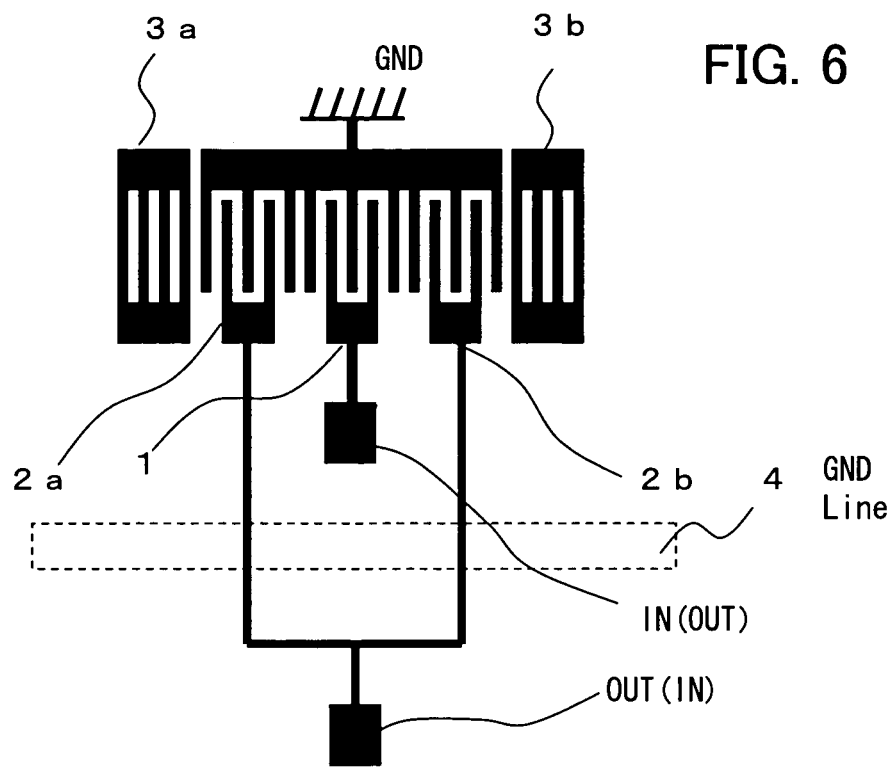
FIG. 6 is a diagram showing an example that a GND pattern forms in an area not limited to the surface layer and the internal layer of the ceramic package such that the GND pattern corresponds to an area between the IN (OUT) terminal and the OUT (IN) terminal of the IDT pattern.
Figure 7:
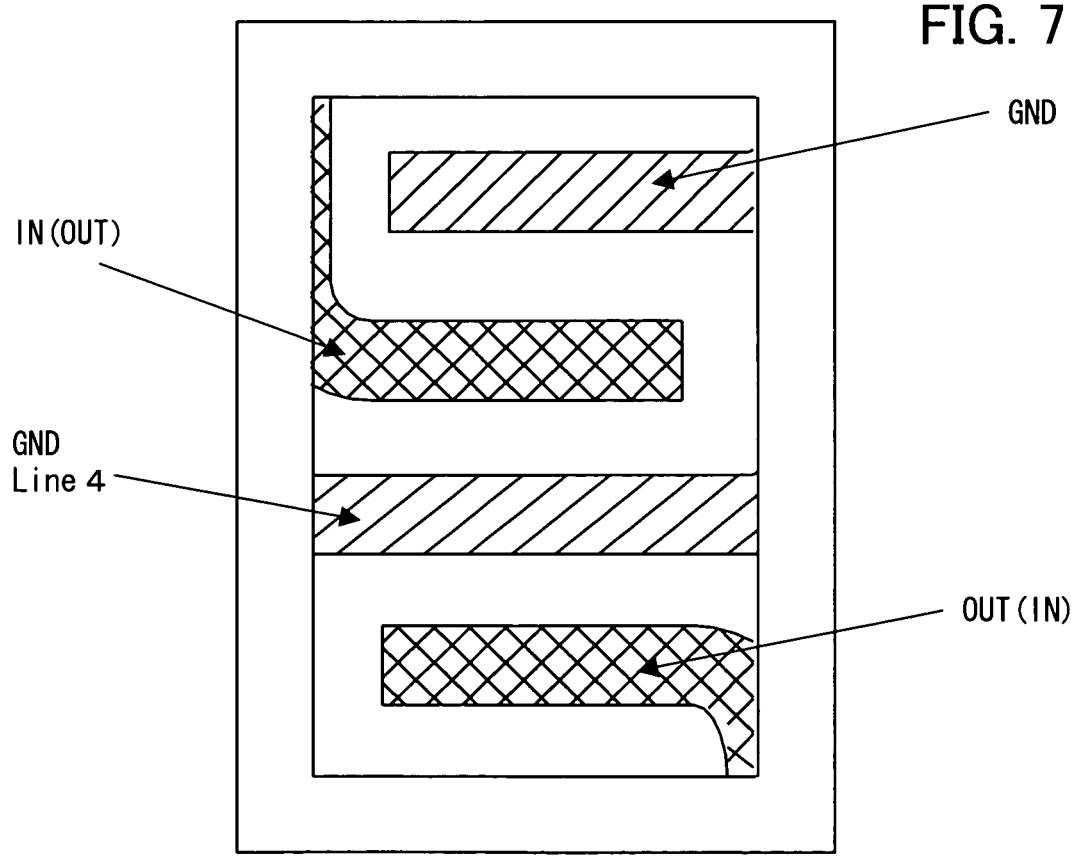
FIGS. 7 is a diagram showing a terminal pattern on the ceramic package side corresponding to the IDT pattern of FIG. 6.

A characteristic of the basic IDT pattern of a double-mode SAW filter shown in FIG. 9A is that, compared to the IDT pattern of FIG. 1, the input IN (or the output OUT) terminal and the output OUT (or input) terminal are disposed opposite to each other sandwiching the grounding GND terminal. A terminal arrangement on the ceramic package side corresponding to the above arrangement is shown in FIG. 9B.

Figure 8:
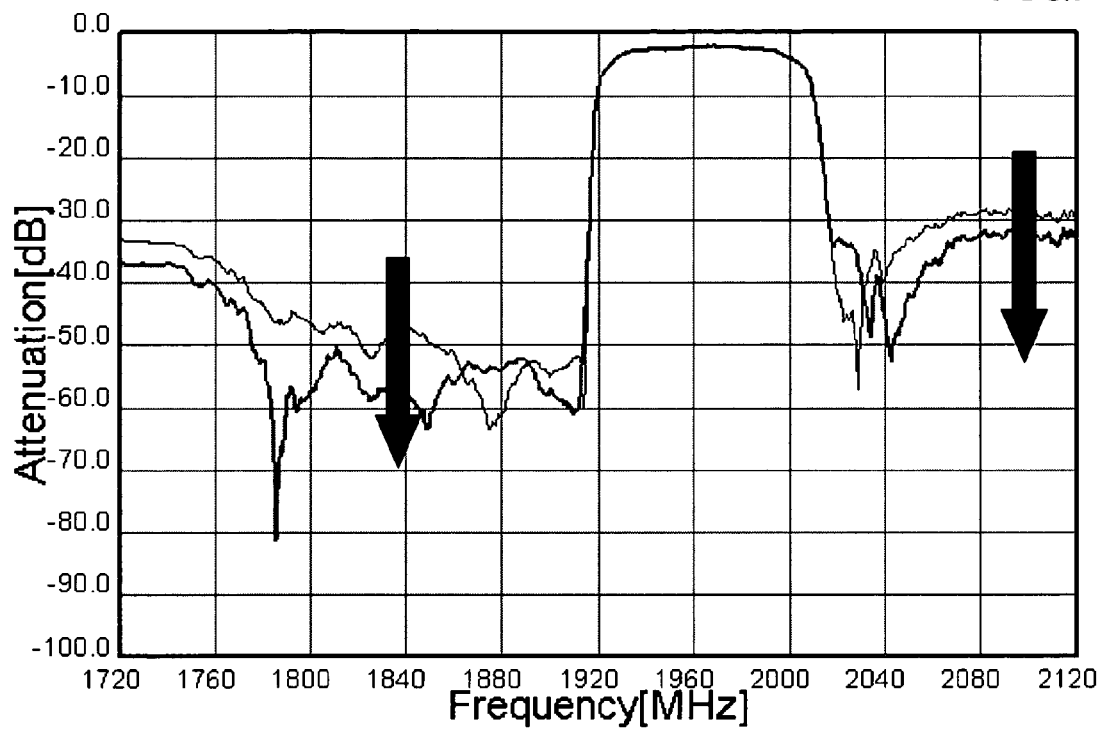
FIG. 8 is a graph of the pass band characteristics showing the effect of the reduction of the coupling capacity formed between the input terminal and the output terminal due to the GND pattern.

As described above, because the input IN terminal and the output OUT terminal are separated from each other using the grounding GND terminal, due to the reduction of the coupling capacity formed between the input terminal and the output terminal as shown in FIG. 8 above, improvement of the attenuation outside the pass band is enabled. Because the grounding GND terminal which separates the input IN terminal and output OUT terminal from each other is the GND terminal of the basic IDT pattern itself, no space for providing any additional GND terminal is necessary. Therefore, the device configuration can be prevented from spreading out in a plane.

For the IDT pattern shown in FIGS. 9A and 9B, forming a routing pattern 5 is necessary in order to dispose the input IN terminal on the opposite side to the output OUT terminal sandwiching the grounding GND terminal. In this case, because the value of resistance in the signal transmission becomes large depending on the length of the pattern 5, reducing the value of resistance by forming the pattern 5 at least with a thick film is desirable.

Using the basic IDT pattern of the double-mode SAW filter shown in FIGS. 9A and 9B, an embodiment of a surface acoustic wave device according to the present invention using an expanded double-mode SAW filter will be described below.

Figure 10A:
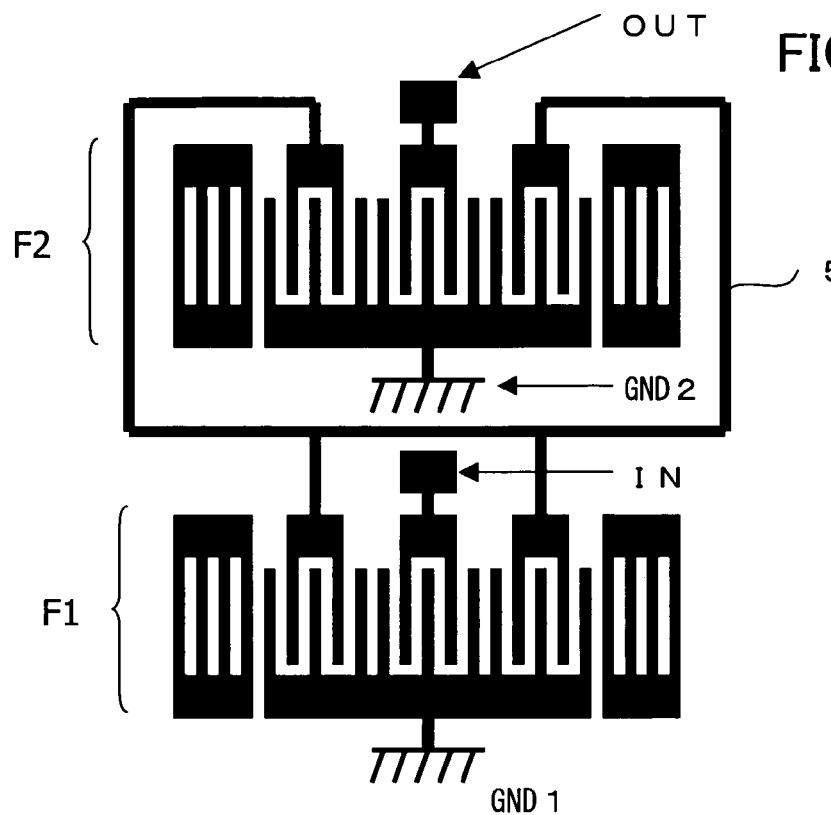
FIG. 10A shows an IDT pattern of the second embodiment.
Figure 10B:
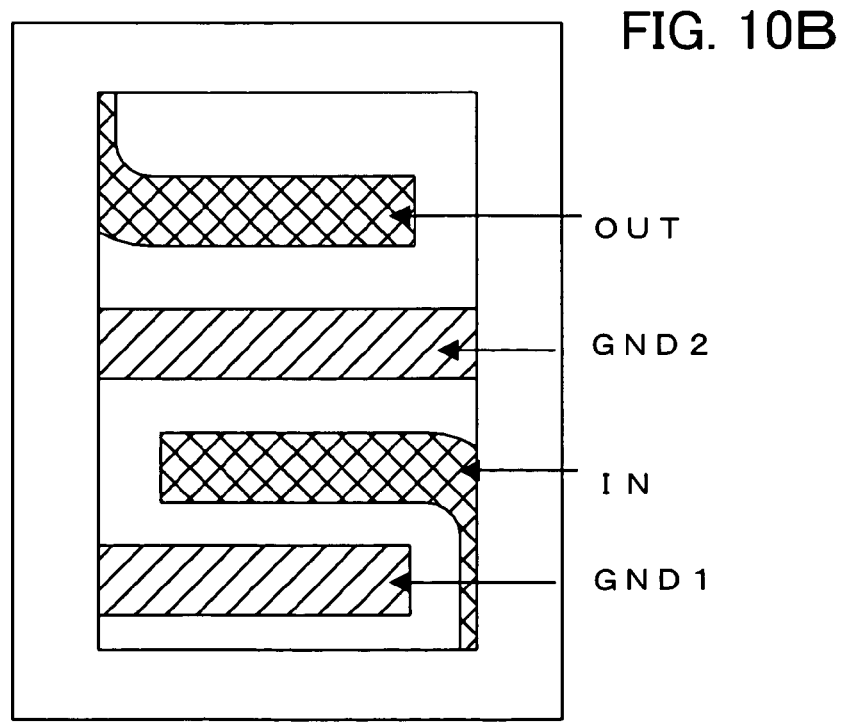
FIG. 10B shows an electrode arrangement on the side of a ceramic package for flip-chip mounting in the second embodiment.

FIGS. 10A and 10B show a second embodiment. FIG. 10A shows an IDT pattern and FIG. 10B shows an electrode arrangement on the side of a ceramic package for flip-chip mounting.

In the second embodiment shown in FIGS. 10A and 10B, a multi-mode SAW filter (F1) in the former stage and another multi-mode SAW filter (F2) in the latter stage are connected in a cascade. An output terminal of the former-stage multi-mode SAW filter (F1) is connected with an input terminal of the latter-stage multi-mode SAW filter (F2) using the routing pattern 5. In this case, for the latter-stage multi-mode SAW filter (F2), the arrangement of the input terminal and the output terminal is inversed compared to the first embodiment of FIG. 9A.

In the above second embodiment, as shown in the electrode arrangement pattern on the package of FIG. 10B, a grounding GND terminal of the latter-stage multi-mode SAW filter (F2) is disposed between the input IN terminal of the former-stage multi-mode SAW filter (F1) and the output OUT terminal of the latter-stage multi-mode SAW filter (F2). Therefore, disposing the grounding GND terminal between the input and the output terminals in a surface acoustic wave device is enabled without expanding the space in a plane.

Figure 11A:
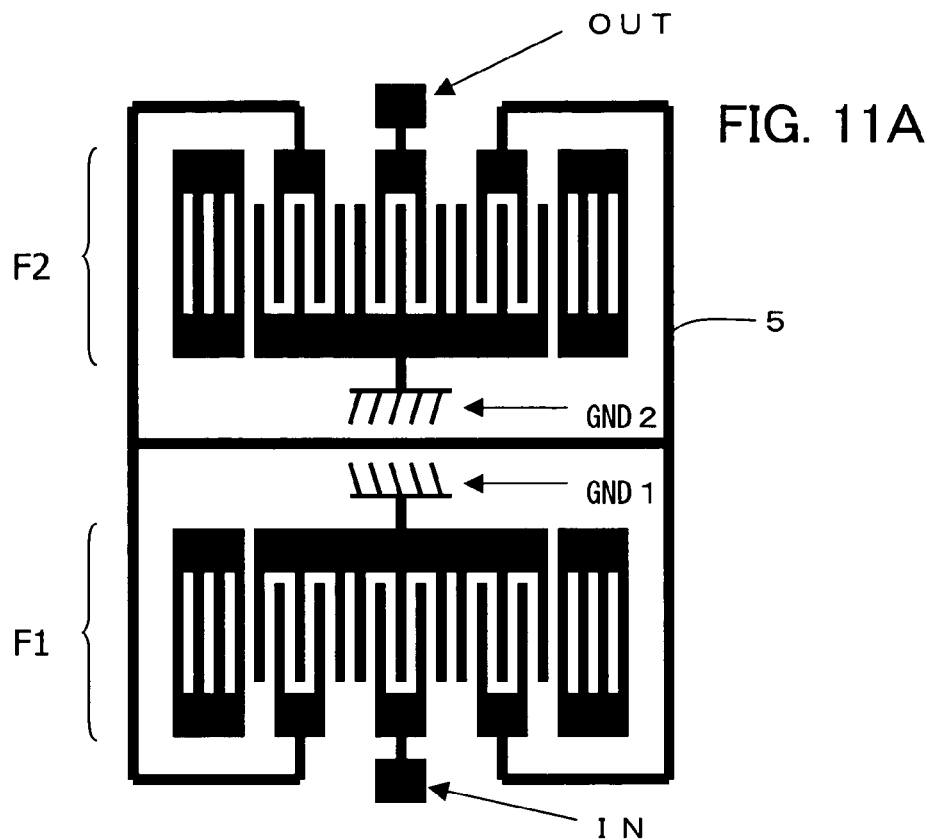
FIG. 11A shows an IDT pattern of the third embodiment.
Figure 11B:
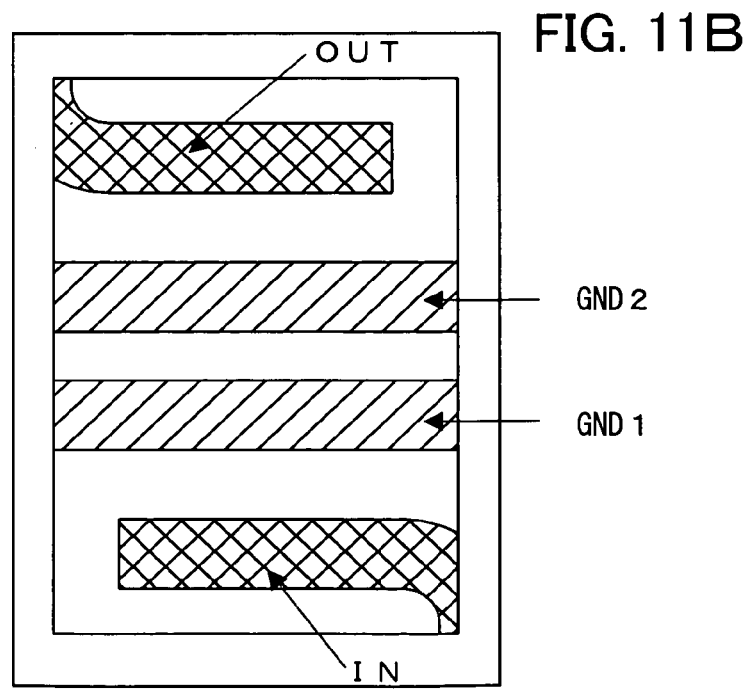
FIG. 11B shows an electrode arrangement on the side of a ceramic package for flip-chip mounting in the third embodiment.

FIGS. 11A and 11B show a third embodiment. FIG. 11A shows an IDT pattern and FIG. 11B shows an electrode arrangement on the side of a ceramic package for flip-chip mounting.

In the embodiment shown in FIGS. 11A and 11B, though IDT patterns of a former-stage multi-mode SAW filter (F1) and a latter-stage multi-mode SAW filter (F2) are each same as the pattern of the embodiment of FIG. 9, one of the patterns is inversed and the patterns are connected in a cascade using the routing pattern 5 with grounded terminals GND1 and GND2 disposed back to back.

Thereby, the input IN terminal of the former-stage multi-mode SAW filter (F1) and the output OUT terminal of the latter-stage multi-mode SAW filter (F2) are strictly separated from each other by the first grounded terminal GND1 and the second grounded terminal GND2. Therefore, the degradation of the filter performance due to the capacity formed between the input terminal and the output terminal can be fully avoided.

Figure 12A:
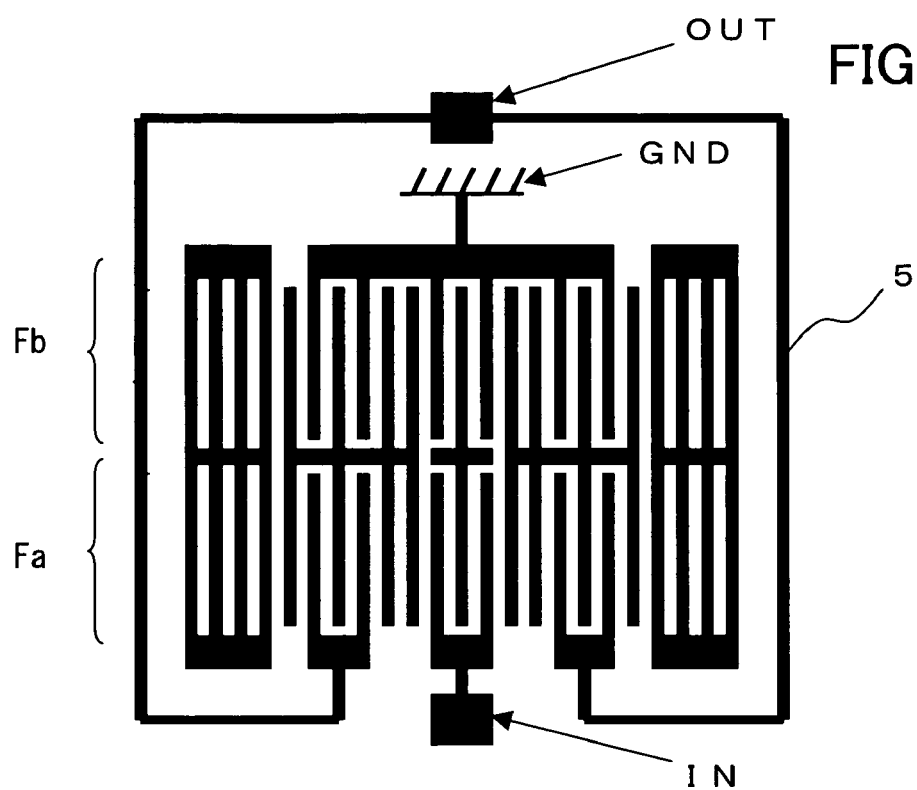
FIG. 12A shows an IDT pattern of the fourth embodiment.
Figure 12B:
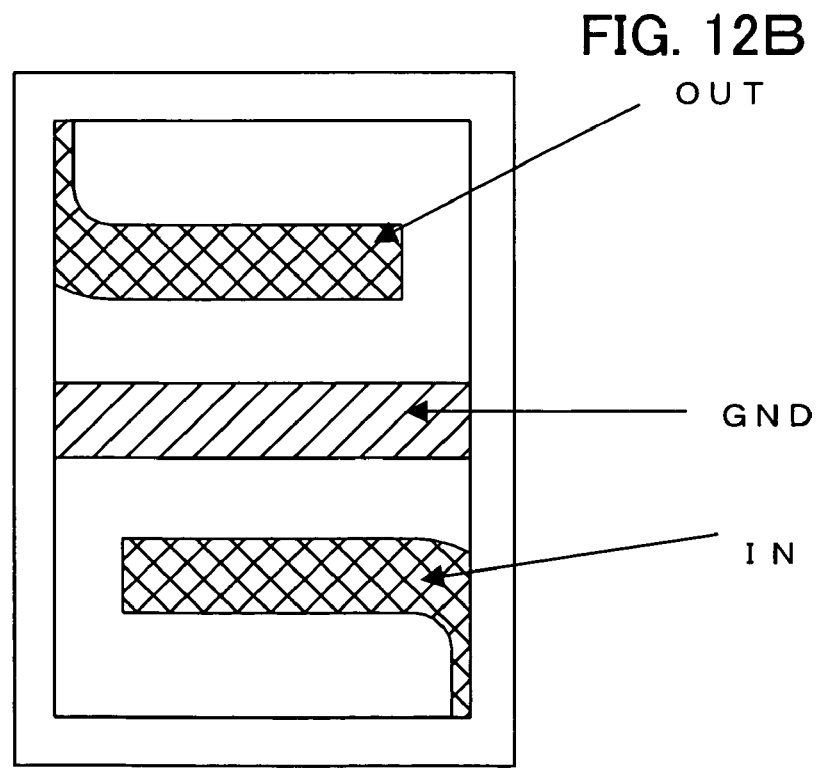
FIG. 12B shows an electrode arrangement on the side of a ceramic package for flip-chip mounting in the fourth embodiment.

FIGS. 12A and 12B show a fourth embodiment. FIG. 12A shows an IDT pattern and FIG. 12B shows an electrode arrangement on the side of a ceramic package for flip-chip mounting.

This embodiment is arranged to connect a first and a second multi-mode SAW filters Fa and Fb in series such that the combined impedance of the impedances of the first and the second filters Fa and Fb is a desired impedance (for example, 50 Ω).

Similarly to the first embodiment shown in FIG. 9A, an output OUT terminal is disposed oppositely to an input IN terminal using the routing pattern 5. Thereby, the coupling capacity formed between the input terminal and the output terminal of the surface acoustic wave device can be reduced.

In the embodiment, when this surface acoustic wave device is applied as a receiving filter of a duplexer or an antenna filter, as described in Japanese Patent Application Publication Nos. 2004-252644 and 2005-130988, because the voltage applied to the IDTs is dispersed due to the serial connection of a plurality of stages and the excitation intensity of the surface acoustic wave per unit area is decreased due to the expansion of the area of the IDT, cross modulation can be suppressed. Due to the dispersion of the voltage applied to the IDT, electrostatic discharge (ESD) and power durability can be improved.

Figure 13A:
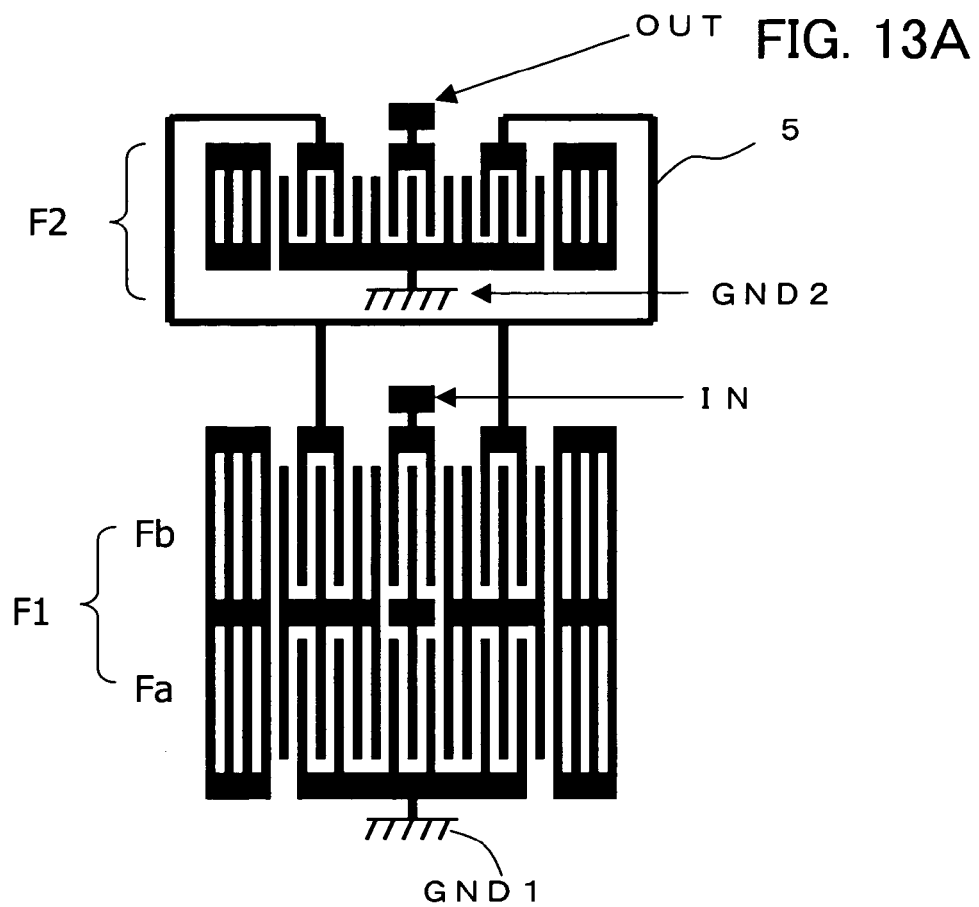
FIG. 13A shows an IDT pattern of the fifth embodiment.
Figure 13B:
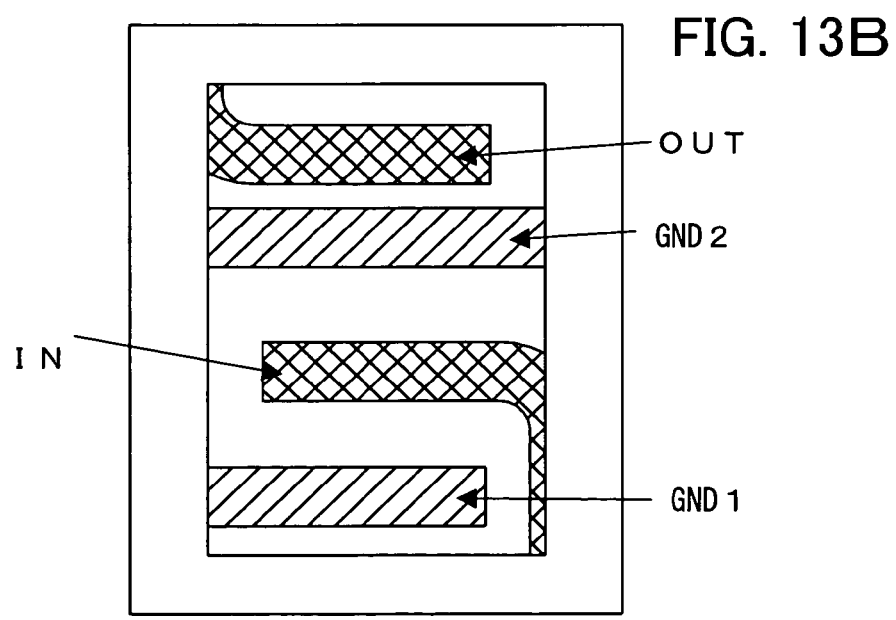
FIG. 13B shows an electrode arrangement on the side of a ceramic package for flip-chip mounting in the fifth embodiment.

FIGS. 13A and 13B show a fifth embodiment. FIG. 13A shows an IDT pattern and FIG. 13B shows an electrode arrangement on the side of a ceramic package for flip-chip mounting.

As this embodiment, the fourth embodiment is applied as the former-stage multi-mode SAW filter in the second embodiment. In this case, the output of the former-stage multi-mode SAW filter (F1) is connected with the routing pattern 5 of the latter-stage multi-mode SAW filter (F2).

Also, in this embodiment, as shown in FIG. 13B, the coupling capacity formed between the input terminal and the output terminal can be reduced by disposing the grounding GND terminal of the latter-stage multi-mode SAW filter (F2) between the input IN terminal and the output OUT terminal. Since the former-stage multi-mode SAW filter (F1) is same as that of the fourth embodiment, the excitation intensity of the surface acoustic wave per unit area is decreased due to the expansion of the area of the IDT and, therefore, an effect that the level of cross modulation is suppressed can be obtained.

Figure 14A:
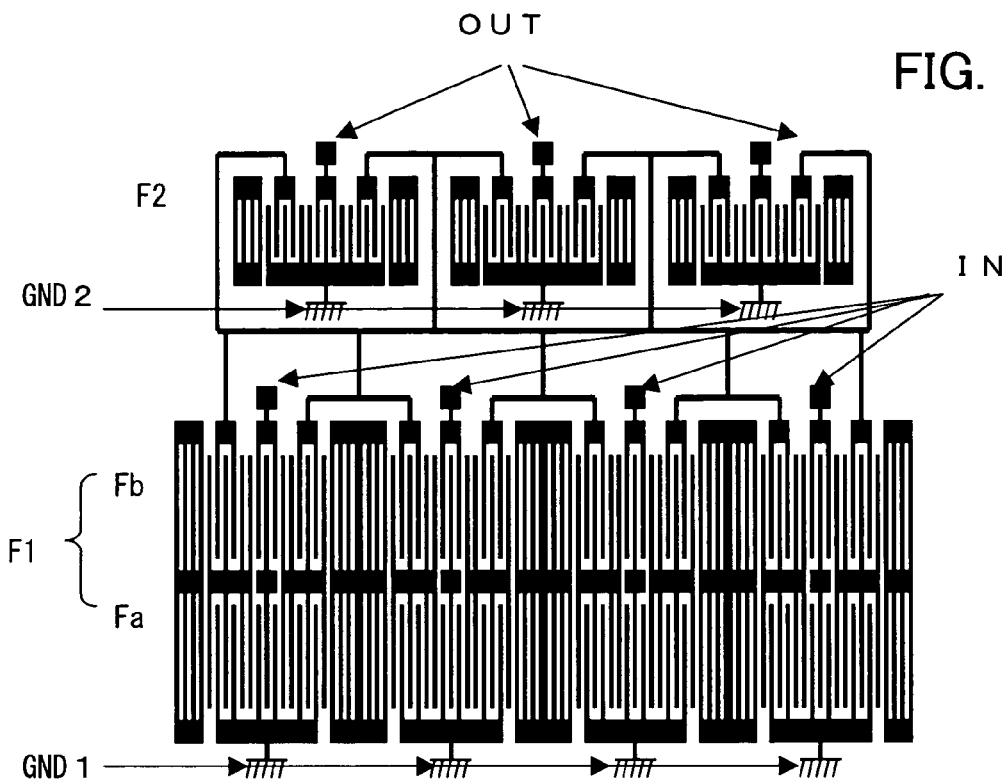
FIG. 14A shows an IDT pattern of the sixth embodiment.
Figure 14B:
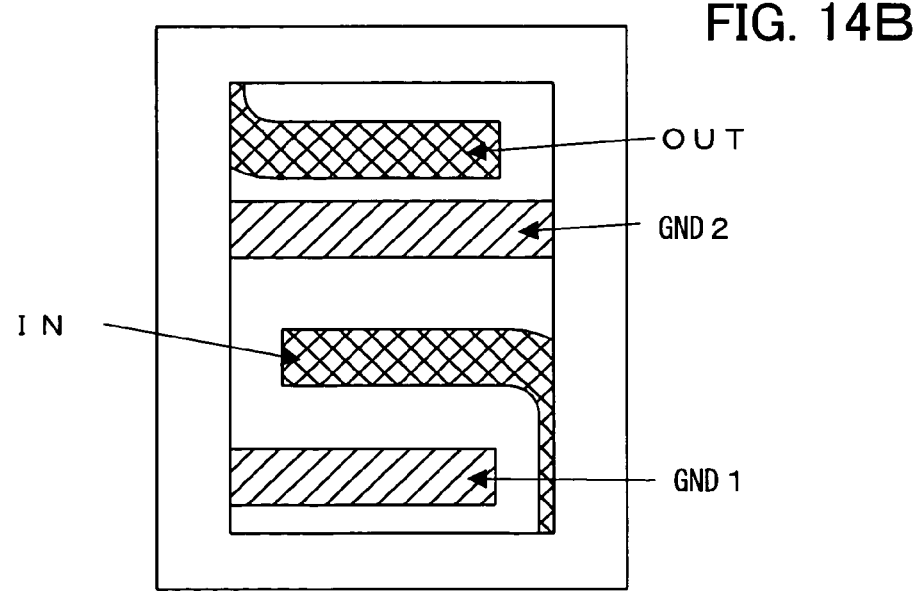
FIG. 14B shows an electrode arrangement on the side of a ceramic package for flip-chip mounting in the sixth embodiment.

FIGS. 14A and 14B show a sixth embodiment. FIG. 14A shows an IDT pattern and FIG. 14B shows an electrode arrangement on the side of a ceramic package for flip-chip mounting.

This embodiment is arranged to connect a plurality of structures shown in the fifth embodiment in parallel. Similarly to other embodiments, in this embodiment, in addition to reducing the coupling capacity formed between the input terminal and the output terminal of the surface acoustic wave device, an electric current can be dispersed by parallel connection. Thereby, improvement of the power durability can be expected. In FIG. 14A, as the embodiment, four (4) former-stage multi-mode SAW filters (F1) are arranged to be parallel and three latter-stage multi-mode SAW filter (F2) are arranged to be parallel such that the number of the filters at the former stage and that of the latter stage differ from each other. However, the numbers may be equal.

As shown in FIG. 14B, FIG. 14B showing the electrode arrangement on the ceramic package side is same as FIG. 13B showing the electrode arrangement on the ceramic package side in the fifth embodiment.

Figure 15A:
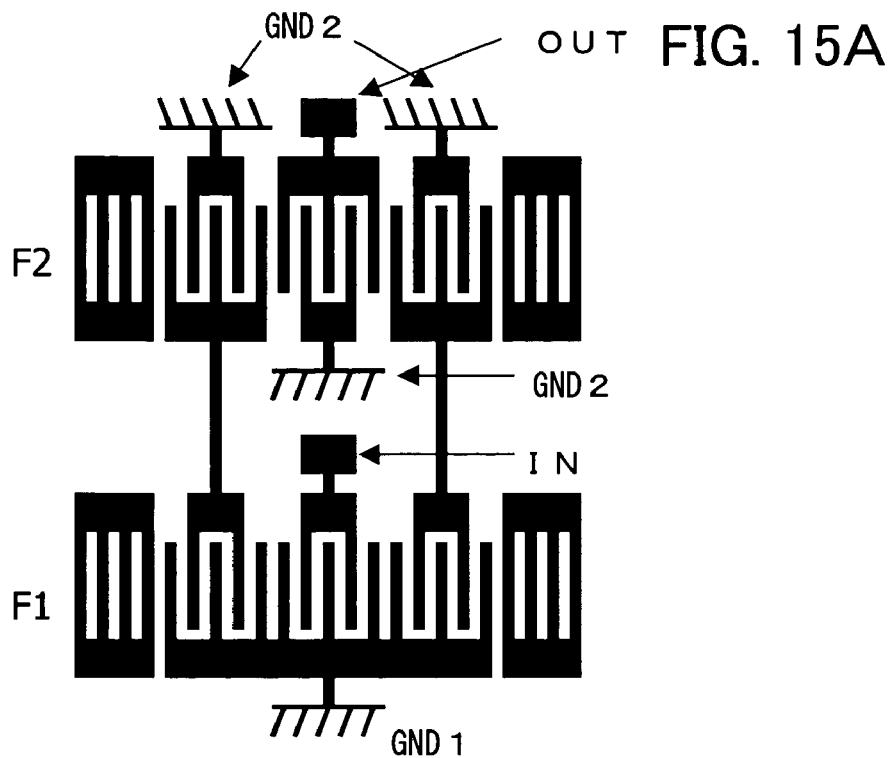
FIG. 15A shows an IDT pattern of the seventh embodiment.
Figure 15B:
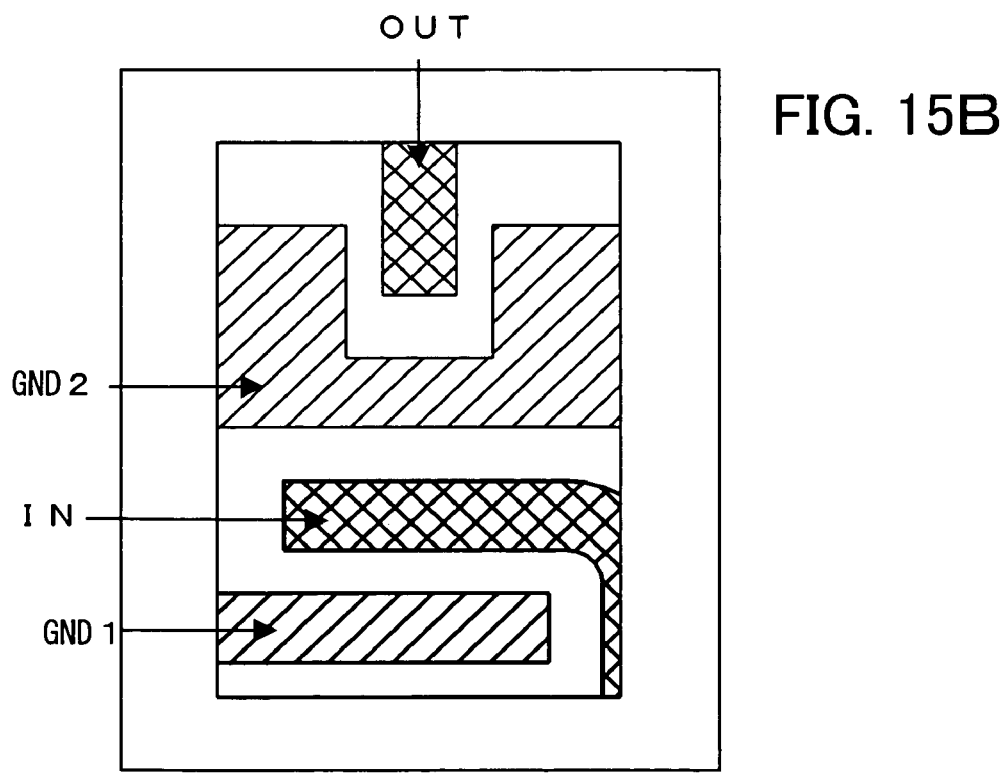
FIG. 15B shows an electrode arrangement on the side of a ceramic package for flip-chip mounting in the seventh embodiment.

FIGS. 15A and 15B show a seventh embodiment. FIG. 15A shows an IDT pattern and FIG. 15B shows an electrode arrangement on the side of a ceramic package for flip-chip mounting.

This embodiment is an example of a configuration arranged to connect the multi-mode SAW filters (F1, F2) in a cascade. By disposing a latter-stage multi-mode SAW filter (F2) in mirror symmetry, a grounding GND pattern (GND2)

can be provided between an input IN terminal and an output OUT terminal patterns on a ceramic package (see FIG. 15B) even when the filters are connected in a cascade. However, as described also in the above Japanese Patent Application Laid-Open Publication No. 2004-194269, the insertion loss and the steepness (shape factor) of the rises between the transmission Tx band and the receiving Rx band are significantly degraded.

Therefore, an input and output IDTs are arranged to be drawn out from the same side as the former-stage multi-mode SAW filter (F1). Thereby, the degradation of the insertion loss and the shape factor can be prevented and the coupling capacity formed between the input terminal and the output terminal of the surface acoustic wave device can be reduced.

Figure 16A:
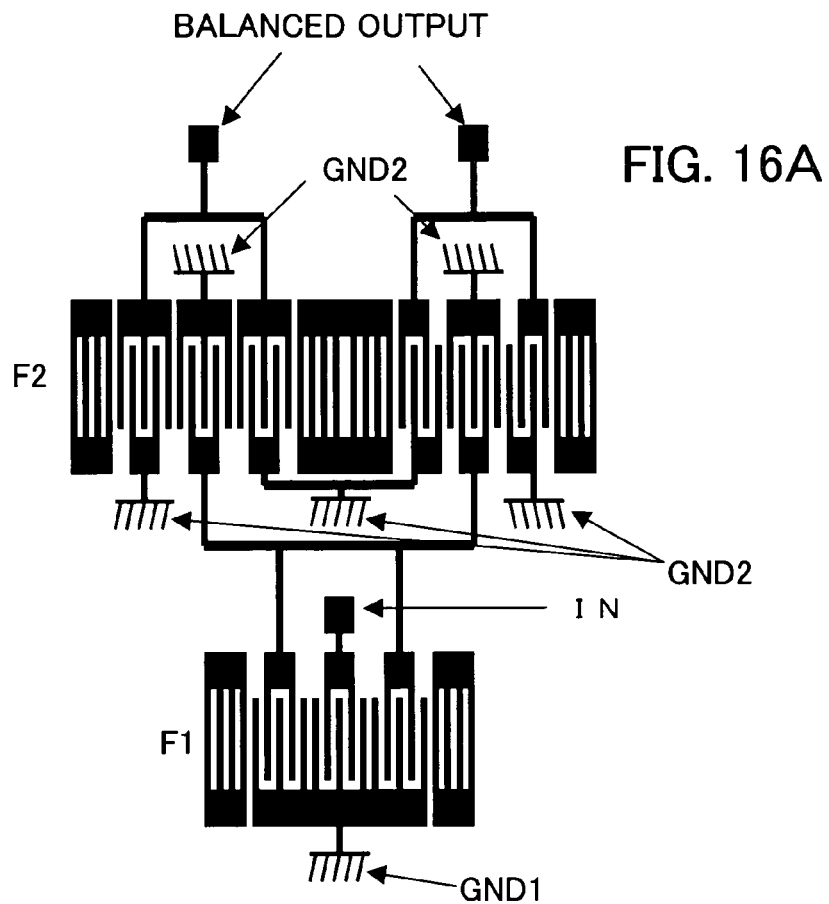
FIG. 16A shows an IDT pattern of the eighth embodiment.
Figure 16B:
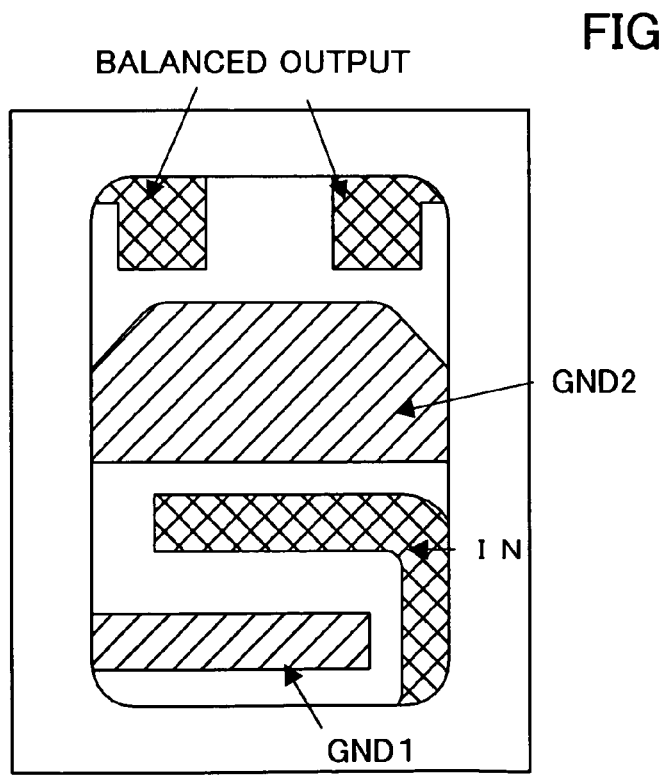
FIG. 16B shows an electrode arrangement on the side of a ceramic package for flip-chip mounting in the eighth embodiment.

As another embodiment, FIGS. 16A and 16B show a eighth embodiment. FIG. 16A shows an IDT pattern and FIG. 16B shows an electrode arrangement on the side of a ceramic package for flip-chip mounting.

This eighth embodiment is a seventh embodiment arranged to have a balanced output OUT terminal for the latter-stage multi-mode SAW filter (F2). Because a grounding GND terminal GND2 is disposed between this balanced output OUT terminal and an input IN terminal of the former-stage multi-mode SAW filter (F1), the coupling capacity formed between the input terminal and the output terminal of the surface acoustic wave can be reduced.

The effect of an application of the surface acoustic wave device applied with the present invention will be described compared to that of the conventional configuration.

Figure 17A:
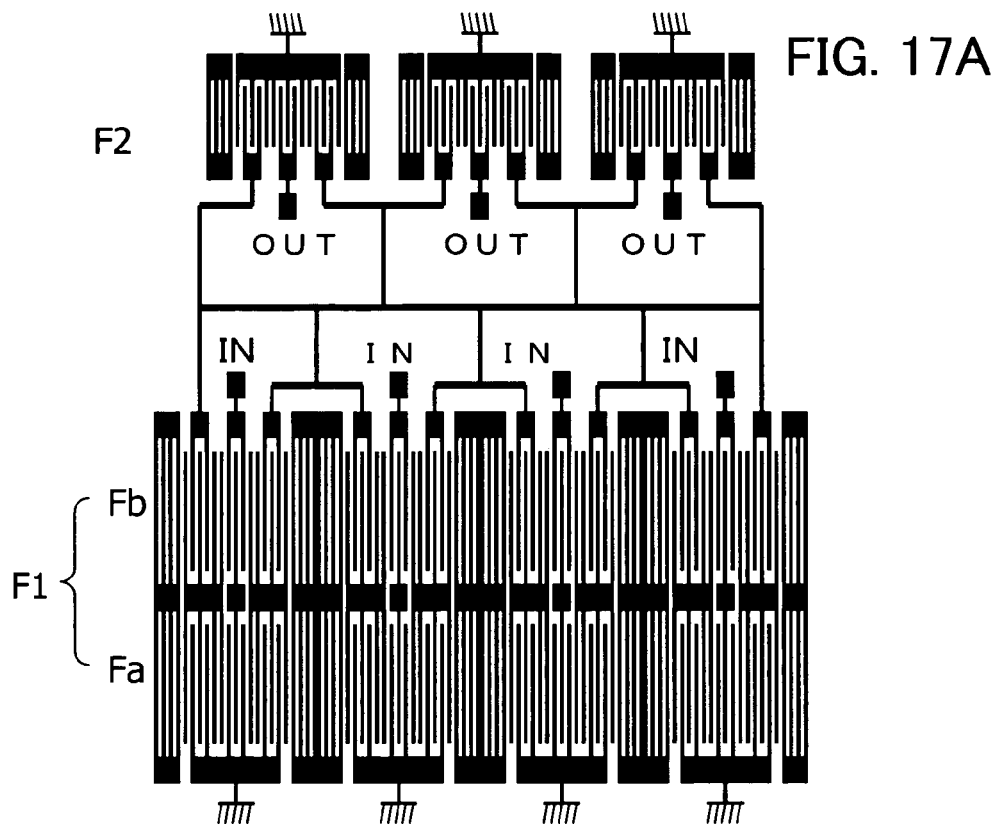
FIGS. 17A shows an IDT pattern of an exemplary conventional configuration compared with the sixth embodiment.
Figure 17B:
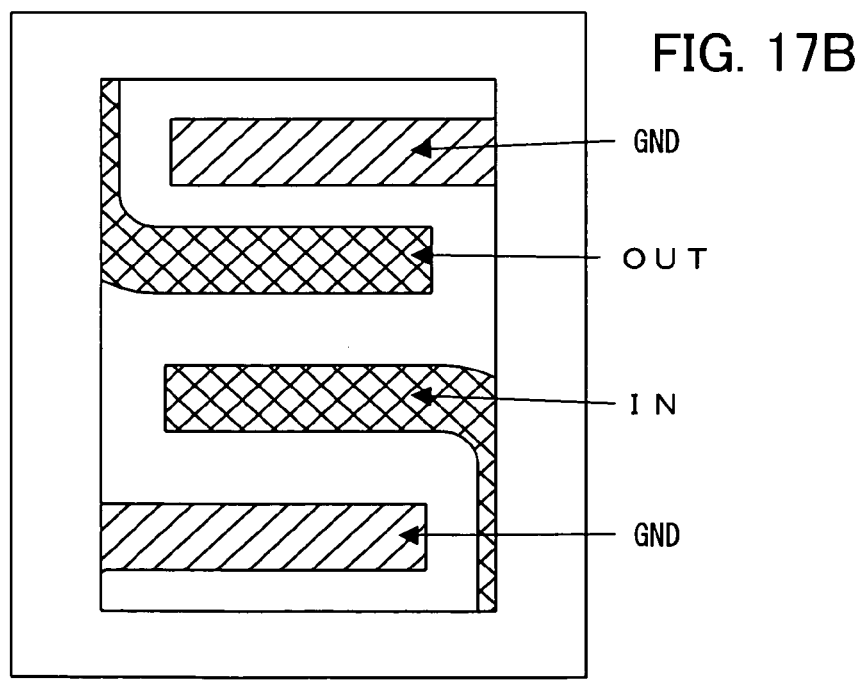
FIG. 17B shows an electrode arrangement of an exemplary conventional configuration compared with the sixth embodiment.

An embodiment of FIGS. 17A and 17B corresponds to the sixth embodiment shown in FIGS. 14A and 14B and is an exemplary conventional configuration with a latter-stage multi-mode SAW filter (F2) not applied with the present invention. FIG. 17A shows an IDT pattern and FIG. 17B shows an electrode arrangement on the side of a ceramic package for flip-chip mounting.

Therefore, the electrical characteristics are compared between the sixth embodiment shown in FIGS. 14A and 14B, and the embodiment not applied with the present invention shown in FIGS. 17A and 17B.

Figure 18A:
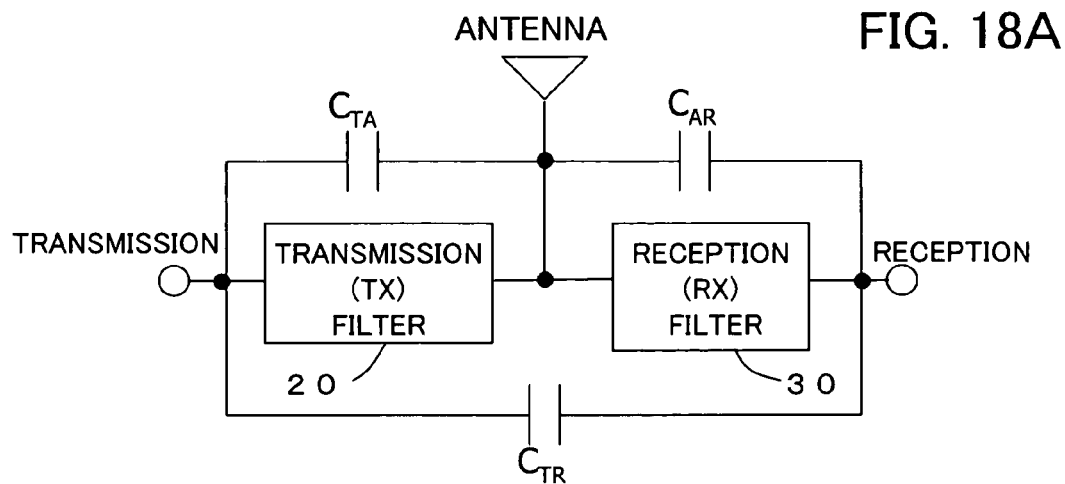
FIG. 18A shows an exemplary configuration of a duplexer.
Figure 18B:
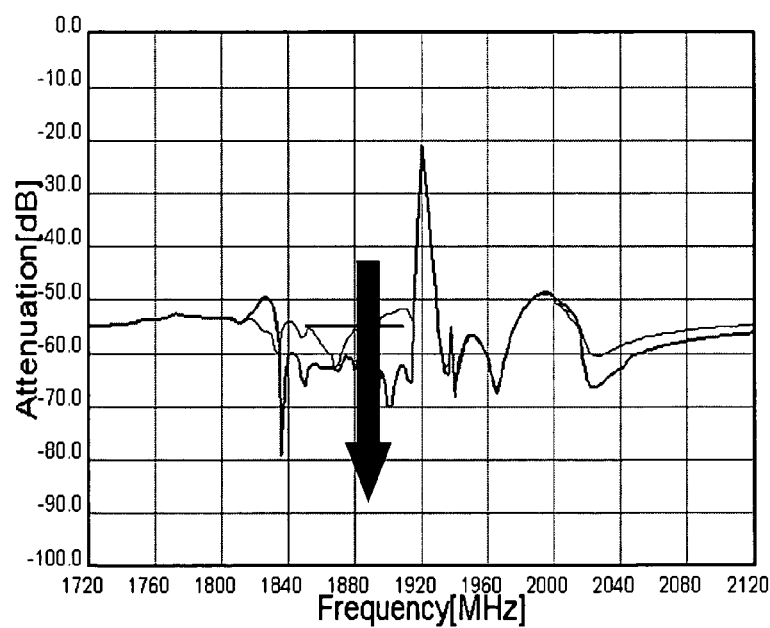
FIG. 18B shows a characteristics of isolation between a transmission signal and a reception signal of a receiving (Rx) filter in the comparative example between FIG. 17A and FIG. 17B, and the sixth embodiment.

FIG. 18A shows an exemplary configuration of a duplexer. FIG. 18B shows the characteristics of isolation between a transmission signal and a reception signal of the sixth embodiment according to the present invention and of an example which employs the comparative example as a receiving (Rx) filter of a PCS duplexer.

In the case of an antenna filter arranged to each have a transmitting filter 20 and a receiving filter 30 in an individual package, improving the amount of the transmission (Tx) band attenuation due to the reduction of $C_{AR}$ of the receiving SAW filter (Rx) according to the present invention leads to improvement of the transmission (Tx) band isolation.

In a duplexer arranged to have the transmitting Tx and receiving Rx filters 20 and 30 in a same package, in addition to the suppressing of $C_{AR}$, suppressing of $C_{TR}$ is effective on the transmission (Tx) band isolation characteristics. Therefore, providing a grounding GND pattern between a transmission Tx and reception Rx in a package is desirable.

From above facts, as shown in FIG. 18B, the standard value of 55 dB required to the transmission Tx band isolation of the PCS duplexer can be satisfied by the present invention.

In the sixth embodiment, the grounding GND pattern effective on the reduction of $C_{AR}$ is used as the grounding GND pattern for the receiving (Rx) filter 30. This pattern surely can also be used as a pattern for the transmission (Tx) filter 20, however, is not used commonly.

The grounding GND pattern provided between the pattern for the transmitting (Tx) filter 20 and the pattern for the receiving (Rx) filter 30, that is effective on the reduction of $C_{TR}$ is provided with a grounding GND pattern for the receiving (Rx) filter 30 and a grounding GND pattern for the transmitting (Tx) filter 20, and these patterns are also not used commonly.

Figure 19A:
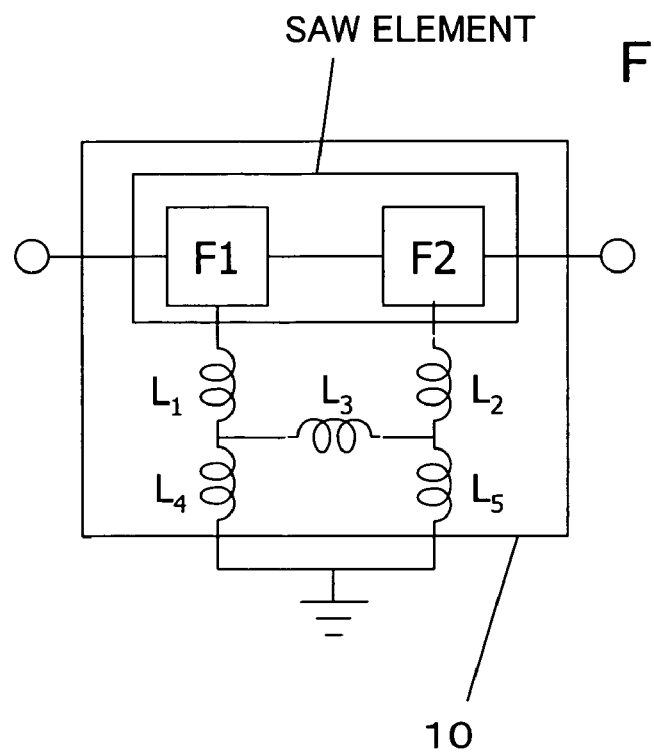
FIG. 19A shows a block diagram of an exemplary configuration of a PCS receiving filter.
Figure 19B:
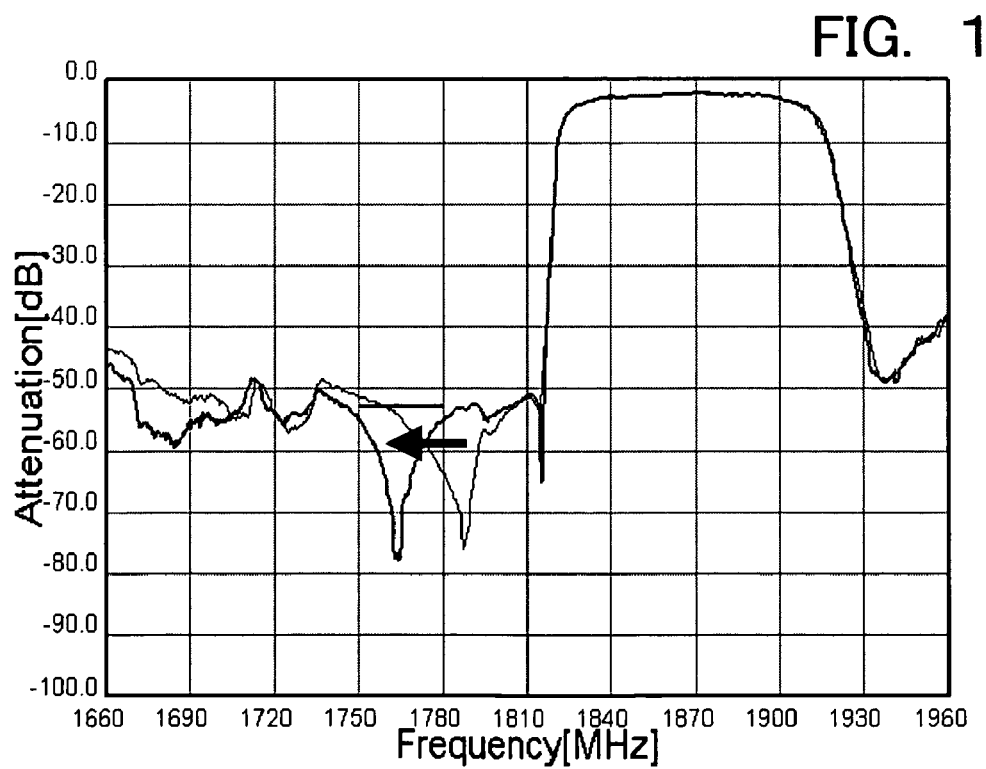
FIG. 19B shows a electrical characteristics obtained when the values of ground GND inductances $L_1$ to $L_5$ of the ceramic package 10 in the sixth embodiment are varied.

However, the patterns may be used commonly (made conductive with each other) for adjustment of the grounding GND inductance, etc. FIG. 19A shows a block diagram of an exemplary configuration of a PCS receiving filter. FIG. 19B shows a electrical characteristics obtained when the values of ground GND inductances $L_1$ to $L_5$ (Korean PCS receiving filter) of the ceramic package 10 in the sixth embodiment shown in FIGS. 14A and 14B are varied. Because the rejection band can be drifted by varying the ground GND inductances, an amount of attenuation can be secured even when the width of transition between the transmission Tx band and the reception Rx band is varied (even when the system is changed).

What is claimed is:

1. A surface acoustic wave device comprising a surface acoustic wave filter having a comb-shaped electrode pattern formed on a piezoelectric element, with electrode terminals for inputting and outputting of the surface acoustic wave filter connected with corresponding electrode patterns of a package through bumps, wherein the comb-shaped electrode pattern has a pair of reflective electrodes, and an input comb-shaped electrode and an output comb-shaped electrode disposed between the pair of reflective electrodes, and wherein an electrode terminal of one of the input comb-shaped electrode and the output comb-shaped electrode is positioned opposite to an electrode terminal of the other comb-shaped electrode with a grounded electrode on the piezoelectric element disposed therebetween using a routing pattern, which passes via outer sides of the pair of reflective electrodes, and wherein the corresponding electrode patterns of the package, to which the electrode terminals for inputting and outputting are oppositely positioned with the grounded electrode on the piezoelectric element, are disposed therebetween.

2. The surface acoustic wave device according to claim 1, wherein the surface acoustic wave filter is a multi-mode surface acoustic wave filter that uses a surface acoustic wave excited between the reflective electrodes and utilizes a plurality of standing waves generated between the reflective electrodes.

3. The surface acoustic wave device according to claim 1, wherein the comb-shaped electrode pattern is arranged to connect in series filters that are formed by dividing a filter into two such that a desired impedance can be obtained.

4. The surface acoustic-wave device according to claim 1, further comprising a plurality of the surface acoustic wave filters connected in parallel.

5. The surface acoustic wave device according to claim 1, wherein the input (or output) terminal of the surface acoustic wave filter is a balanced input (or output).

6. The surface acoustic wave device according to claim 1, wherein an electrode pattern of the package is an inductance component constituting the filter.

7. An antenna duplexer comprising the surface acoustic wave device according to claim 1 as a transmission filter and/or a reception filter.

8. The antenna duplexer according to claim 7, wherein the grounding pattern is formed between an electrode pattern for transmission (Tx) signal connected with the transmission filter and an electrode pattern for reception (Rx) signal connected with the reception filter in the package.

9. A surface acoustic wave device comprising a first and a second surface acoustic wave filters each having a comb-shaped electrode pattern formed on a piezoelectric element the first and the second acoustic wave filters connected with each other in a cascade, with electrode terminals for inputting and outputting of the surface acoustic wave filters connected with corresponding electrode patterns of a package through bumps, wherein the comb-shaped electrode patterns of the first and the second surface acoustic wave filters each have a pair of reflective electrodes, and an input comb-shaped electrode and an output comb-shaped electrode disposed between the pair of reflective electrodes, wherein electrode terminals of the input and the output comb-shaped electrodes are drawn out from the same side for each of the first and the second surface acoustic wave filters, and wherein the electrode terminal of the output (or input) comb-shaped electrode of the first surface acoustic wave filter is connected with the electrode terminal of the input (or output) comb-shaped electrode of the second surface acoustic wave filter using a routing pattern, the electrode terminals of the input and output comb-shaped electrodes of the first surface acoustic wave filter facing the second surface acoustic wave filter with a grounded terminal of the second surface acoustic wave filter disposed therebetween.

10. The surface acoustic wave device according to claim 9, wherein the electrode pattern of at least one surface acoustic wave filter of the first and the second surface acoustic wave filter is arranged to connect in series filters that are formed by dividing a filter into two such that a desired impedance can be obtained.

11. The surface acoustic wave device according to claim 9, further comprising a plurality of the surface acoustic wave filters connected in parallel.

12. The surface acoustic wave device us according to claim 9, wherein an electrode pattern of the package is an inductance component constituting the filter.

13. An antenna duplexer comprising the surface acoustic wave device according to claim 9 as a transmission filter and/or a reception filter.

14. A surface acoustic wave device comprising a first and a second surface acoustic wave filters connected with each other in a cascade, with electrode terminals for inputting and outputting of the surface acoustic wave filters connected with corresponding electrode patterns of a package through bumps, wherein the comb-shaped electrode patterns of the first and the second surface acoustic wave filters each have a pair of reflective electrodes, and an input comb-shaped electrode and an output comb-shaped electrode disposed between the pair of reflective electrodes, wherein
  electrode terminals of the input and the output comb-shaped electrodes are drawn from the same side for each of the first and the second surface acoustic wave filters;
  the electrode terminal of the output or input comb-shaped electrode of the first surface acoustic wave filter is connected with the electrode terminal of the input or output comb-shaped electrode of the second surface acoustic wave filter using a routing wire, which passes via outer sides of the pair of reflective electrodes, with a grounded terminal of the first surface acoustic wave filter facing a grounded terminal of the second surface acoustic wave filter, and wherein
  the corresponding electrode patterns of the package, to which the electrode terminals for inputting and outputting are oppositely positioned with the grounded electrode on the piezoelectric element, are disposed therebetween.

15. The surface acoustic wave device according to claim 14, wherein the electrode pattern of at least one surface acoustic wave filter of the first and the second surface acoustic wave filter is arranged to connect in series filters that are formed by dividing a filter into two such that a desired impedance can be obtained.

16. The surface acoustic wave device according to claim 14, further comprising a plurality of the surface acoustic wave filters connected in parallel.

17. The surface acoustic wave device according to claim 14, wherein an electrode pattern of the package is an inductance component constituting the filter.

18. An antenna duplexer comprising the surface acoustic wave device according to claim 14 as a transmission filter and/or a reception filter.

* * * * *